(12) United States Patent
Oishi

(10) Patent No.: US 10,917,063 B2
(45) Date of Patent: Feb. 9, 2021

(54) MULTILAYER LC FILTER

(71) Applicant: Murata Manufacturing Co., Ltd., Nagaokakyo (JP)

(72) Inventor: Akihito Oishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/429,099

(22) Filed: Jun. 3, 2019

(65) Prior Publication Data

US 2019/0288659 A1 Sep. 19, 2019

Related U.S. Application Data

(63) Continuation of application No. PCT/JP2017/037973, filed on Oct. 20, 2017.

(30) Foreign Application Priority Data

Dec. 4, 2016 (JP) .................................. 2016-235487

(51) Int. Cl.
*H03H 7/01* (2006.01)
*H01F 27/28* (2006.01)
(Continued)

(52) U.S. Cl.
CPC ....... *H03H 7/0115* (2013.01); *H01F 17/0013* (2013.01); *H01F 27/2804* (2013.01); *H01F 27/40* (2013.01); *H01G 4/012* (2013.01); *H01G 4/30* (2013.01); *H01G 4/385* (2013.01); *H01G 4/40* (2013.01); *H03H 7/01* (2013.01); *H03H 7/075* (2013.01); *H01F 27/292* (2013.01); *H01F 2017/0026* (2013.01); *H01F 2027/2809* (2013.01); *H03H 2001/0085* (2013.01)

(58) Field of Classification Search
CPC .................... H03H 2001/0085; H03H 7/0115
USPC .................................................. 333/175, 185
See application file for complete search history.

(56) References Cited

U.S. PATENT DOCUMENTS

| | | | |
|---|---|---|---|
| 2012/0112856 A1 | 5/2012 | Mizoguchi | |
| 2014/0077895 A1 | 3/2014 | Imamura | |

(Continued)

FOREIGN PATENT DOCUMENTS

| | | | |
|---|---|---|---|
| JP | 2004-014885 A | 1/2004 | |
| JP | 2006-066769 A | 3/2006 | |

(Continued)

OTHER PUBLICATIONS

Official Communication issued in International Patent Application No. PCT/JP2017/037973, dated Dec. 26, 2017.

*Primary Examiner* — Rakesh B Patel
(74) *Attorney, Agent, or Firm* — Keating & Bennett, LLP

(57) ABSTRACT

A multilayer LC filter includes a multilayer body in which dielectric layers are laminated, first linear conductive patterns, second linear conductive patterns, third linear conductive patterns, capacitor conductive patterns, ground conductive patterns, and via conductors. When the multilayer body is seen through in the direction in which the dielectric layers are laminated, the first linear conductive patterns and the third linear conductive patterns in a first inductor intersect with each other, and the first linear conductive patterns and the third linear conductive patterns in a second inductor intersect with each other.

8 Claims, 11 Drawing Sheets

(51) Int. Cl.
 *H01F 27/40* (2006.01)
 *H01G 4/012* (2006.01)
 *H01G 4/30* (2006.01)
 *H01G 4/38* (2006.01)
 *H01G 4/40* (2006.01)
 *H01F 17/00* (2006.01)
 *H03H 7/075* (2006.01)
 *H01F 27/29* (2006.01)
 *H03H 1/00* (2006.01)

(56) References Cited

U.S. PATENT DOCUMENTS

2014/0333407 A1 11/2014 Otsubo
2015/0116056 A1* 4/2015 Masuda ............... H03H 7/0115
 333/185

FOREIGN PATENT DOCUMENTS

| JP | 2012-105026 A | 5/2012 |
| JP | 2014-057277 A | 3/2014 |
| WO | 2013/146568 A1 | 10/2013 |

* cited by examiner

MULTILAYER LC FILTER

CROSS REFERENCE TO RELATED APPLICATIONS

This application claims the benefit of priority to Japanese Patent Application No. 2016-235487 filed on Dec. 4, 2016 and is a Continuation Application of PCT Application No. PCT/JP2017/037973 filed on Oct. 20, 2017. The entire contents of each application are hereby incorporated herein by reference.

BACKGROUND OF THE INVENTION

1. Field of the Invention

The present invention relates to multilayer LC filters, and more specifically, to a multilayer LC filter including an inductor with a large inductance value and a high Q value and having a low insertion loss.

2. Description of the Related Art

A multilayer LC filter in which an inductor and a capacitor are disposed inside a multilayer body including a plurality of dielectric layers laminated therein is used in various electronic devices.

One example of such a multilayer LC filter is disclosed in Japanese Unexamined Patent Application Publication No. 2014-57277.

FIG. 11 illustrates a multilayer LC filter (high-frequency filter) 1000 disclosed in Japanese Unexamined Patent Application Publication No. 2014-57277.

The multilayer LC filter 1000 includes a multilayer body 101 in which eight dielectric layers (insulator layers) 101a to 101h are laminated.

A first input/output terminal (outer electrode) 102a, a second input/output terminal (outer electrode) 102b, and a ground terminal (outer electrode) 103 are disposed on a lower principal surface of the dielectric layer 101a.

Two capacitor conductive patterns (resonance capacitor conductors) 104a and 104b are disposed on an upper principal surface of the dielectric layer 101b.

Six via conductors 105a to 105f are disposed in the dielectric layer 101b.

A ground conductive pattern (ground conductor) 106 is disposed on an upper principal surface of the dielectric layer 101c.

The four via conductors 105c to 105f are disposed in the dielectric layer 101c. Two via conductors 105g and 105h are disposed in the dielectric layer 101c. Via conductors having the same reference numerals disposed in different dielectric layers are joined together. For example, the via conductor 105c disposed in the dielectric layer 101b and the via conductor 105c disposed in the dielectric layer 101c are an integrated element in which both are joined together and have the same reference numeral (the same applies to the following description in the present specification).

Two capacitor conductive patterns 104c and 104d are disposed on an upper principal surface of the dielectric layer 101d.

The two via conductors 105g and 105h are disposed in the dielectric layer 101d. Four via conductors 105i to 105l are disposed in the dielectric layer 101d.

A floating conductor 107 is disposed on an upper principal surface of the dielectric layer 101e.

The six via conductors 105g to 105l are disposed in the dielectric layer 101e. Two via conductors 105m and 105n are disposed in the dielectric layer 101e.

Four linear conductive patterns (line conductors) 108a to 108d are disposed on an upper principal surface of the dielectric layer 101f.

The eight via conductors 105g to 105n are disposed in the dielectric layer 101f.

Four linear conductive patterns 108e to 108h are disposed on an upper principal surface of the dielectric layer 101g.

The eight via conductors 105g to 105n are disposed in the dielectric layer 101g.

The dielectric layer 101h is a protective layer. None of the conductive patters are disposed on the dielectric layer 101h, and none of the via conductors are disposed therein.

The first input/output terminal 102a and the capacitor conductive pattern 104a are connected by the via conductor 105a. The second input/output terminal 102b and the capacitor conductive pattern 104b are connected by the via conductor 105b. Moreover, the ground terminal 103 and the ground conductive pattern 106 are connected by the four via conductors 105c to 105f.

In the multilayer LC filter 1000, four loop inductors (first inductor to fourth inductor) are provided inside the multilayer body 101 using the via conductors 105g to 105n and the linear conductive patterns 108a to 108h.

First, the via conductor 105g, the linear conductive patterns 108a and 108e, and the via conductor 105i are connected in sequence so as to have a loop shape, and define the first inductor having a loop via structure between the capacitor conductive pattern 104a and the ground conductive pattern 106. In the first inductor, the Q value is improved by a reduction in internal resistance achieved by connecting the two linear conductive patterns 108a and 108e as one set (the same applies to the second inductor to the fourth inductor described below).

The via conductor 105m, the linear conductive patterns 108b and 108f, and the via conductor 105j are connected in sequence so as to have a loop shape, and define the second inductor having a loop via structure between the capacitor conductive pattern 104c and the ground conductive pattern 106.

The via conductor 105n, the linear conductive patterns 108c and 108g, and the via conductor 105k are connected in sequence so as to have a loop shape, and define the third inductor having a loop via structure between the capacitor conductive pattern 104d and the ground conductive pattern 106.

The via conductor 105h, the linear conductive patterns 108d and 108h, and the via conductor 105l are connected in sequence so as to have a loop shape, and define the fourth inductor having a loop via structure between the capacitor conductive pattern 104b and the ground conductive pattern 106.

In the multilayer LC filter 1000, first to fourth capacitors are provided inside the multilayer body 101 using the capacitor conductive patterns 104a to 104d and the ground conductive pattern 106.

First, the capacitance between the capacitor conductive pattern 104a and the ground conductive pattern 106 defines the first capacitor.

The capacitance between the capacitor conductive pattern 104c and the ground conductive pattern 106 defines the second capacitor.

The capacitance between the capacitor conductive pattern 104d and the ground conductive pattern 106 defines the third capacitor.

The capacitance between the capacitor conductive pattern 104b and the ground conductive pattern 106 defines the fourth capacitor.

The first inductor and the first capacitor are connected in parallel, and define a first LC resonator. The second inductor and the second capacitor are connected in parallel, and define a second LC resonator. The third inductor and the third capacitor are connected in parallel, and define a third LC resonator. The fourth inductor and the fourth capacitor are connected in parallel, and define a fourth LC resonator.

In the multilayer LC filter 1000, the first LC resonator to the fourth LC resonator are connected in sequence between the first input/output terminal 102a and the second input/output terminal 102b, and define a four-stage band pass filter.

The multilayer LC filter 1000 has a problem in that it is difficult to increase the inductance value of each of the first inductor to the fourth inductor because each of the first inductor to the fourth inductor has a simple loop via structure in which the via conductor, the linear conductive patterns, and the via conductor are connected in sequence so as to have a loop shape (the via conductors are connected to both sides of the linear conductive patterns). That is, for the inductor having the simple loop via structure, because the proportion of the lengths of the two via conductors connected to both sides of the linear conductive patterns in the inductor length is large, in order to increase the inductor length and the inductance value, it is efficient and preferred to increase the length of each of the two via conductors. However, for a multilayer LC filter, such as the multilayer LC filter 1000, in order to increase the length of the via conductor included in the inductor, it is necessary to increase the number of the laminated dielectric layers or to thicken each of the dielectric layers, and this produces a problem in that the dimension of the height of the multilayer LC filter (multilayer body) is large. Therefore, it is difficult in the multilayer LC filter 1000 to increase the inductance values of the first inductor to the fourth inductor.

In an LC filter (including the multilayer LC filter), it is preferable that the inductance value of the inductor included in each LC resonator is increased, the Q value of the inductor is increased, and the insertion loss is reduced. However, for the multilayer LC filter 1000, because the height dimension would be increased, it is difficult to increase the inductance value of each of the first inductor to the fourth inductor, to raise the Q value of each of the first inductor to the fourth inductor, and to reduce the insertion loss.

In the LC filter (including the multilayer LC filter), in order to obtain desired frequency characteristics, it may be required that the inductance value of the inductor included in each LC resonator is set at a large value. However, for the multilayer LC filter 1000, because the height dimension would be increased, it is difficult to increase the inductance value of each of the first inductor to the fourth inductor and to obtain desired frequency characteristics.

In recent years, for electronic devices, such as smart phones, tablet computers, cellular phones, and portable music players, a reduction in thickness has been required in the market, and the reduction in thickness has been accelerated. With the reduction in thickness in electronic devices, the reduction in profile (reduction in thickness) is also strongly desired in electronic components used in the electronic devices, and the multilayer LC filter is no exception. However, if the profile of the multilayer LC filter 1000 is reduced, because the lengths of the two via conductors in each of the first inductors to the fourth inductor are shortened, the inductance value is reduced and the Q value is lowered. This may result in increasing the insertion loss or failing to obtain desired frequency characteristics, and there is a problem in that the reduction in profile is difficult.

SUMMARY OF THE INVENTION

Preferred embodiments of the present invention provide multilayer bodies each of which includes a plurality of dielectric layers that are laminated, a plurality of linear conductive patterns between the dielectric layers, a plurality of capacitor conductive patterns are provided between the dielectric layers, at least one ground conductive pattern is provided between the dielectric layers, and a plurality of via conductors extending through the dielectric layers. Combinations in which the via conductors and the linear conductive patterns are alternately connected define a plurality of inductors. Capacitances between the capacitor conductive patterns and the ground conductive pattern or capacitances between the capacitor conductive patterns define a plurality of capacitors. Combinations in which the inductors and the capacitors are connected define a plurality of LC resonators. At least one of the inductors includes at least three of the linear conductive patterns, and when the multilayer body is seen through in a direction in which the dielectric layers are laminated, the two linear conductive patterns included in the at least one inductor intersect with each other.

At least one of the inductors may include at least a first linear conductive pattern, a second linear conductive pattern, and a third linear conductive pattern, at least one of the capacitor conductive patterns and the first linear conductive pattern may be connected by at least one of the via conductors, the first linear conductive pattern and the second linear conductive pattern may be connected by at least one of the via conductors, the second linear conductive pattern and the third linear conductive pattern may be connected by at least one of the via conductors, the third linear conductive pattern and the ground conductive pattern may be connected by at least one of the via conductors, and when the multilayer body is seen through in the direction in which the dielectric layers are laminated, the first linear conductive pattern and the third linear conductive pattern may intersect with each other. In this case, the multilayer LC filter according to a preferred embodiment of the present invention is able to be easily configured.

The second linear conductive pattern, the third linear conductive pattern, and the first linear conductive pattern may preferably be laminated in this order inside the multilayer body, and a distance between the second linear conductive pattern and the third linear conductive pattern may preferably be longer than a distance between the third linear conductive pattern and the first linear conductive pattern. Alternatively, the second linear conductive pattern, the first linear conductive pattern, and the third linear conductive pattern may preferably be laminated in this order inside the multilayer body, and a distance between the second linear conductive pattern and the first linear conductive pattern may preferably be longer than a distance between the first linear conductive pattern and the third linear conductive pattern. In these cases, the volume inside the multilayer body is able to be effectively used, the inductance value of the inductor is able to be increased, and the Q value of the inductor is able to be improved.

An angle of the intersection may preferably be about 90 degrees. In this case, mutual interference of magnetic fluxes produced by the intersecting linear conductive patterns is able to be reduced to a minimal level, the inductance value of the inductor is able to be increased, and the Q value of the inductor is able to be improved.

In a multilayer LC filter according to a preferred embodiment of the present invention, because the inductor length of the inductor is long, the inductance value of the inductor is large, and thus, the Q value of the inductor is large. Accordingly, the insertion loss of the multilayer LC filter according to a preferred embodiment of the present invention is small.

A multilayer LC filter according to a preferred embodiment of the present invention achieves an increased inductance value of the inductor and an inductance value of the inductor set at a desired value. Therefore, desired frequency characteristics are easily obtainable.

The multilayer LC filters according to preferred embodiments of the present invention are able to prevent reduction in the inductance value and the Q value of the inductor even with a reduced profile, and thus, the reduction in profile is able to be achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
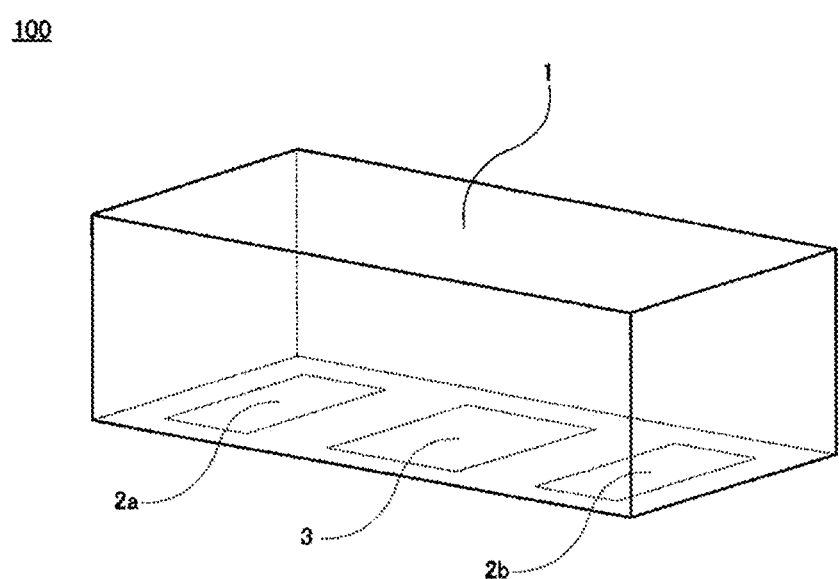
FIG. 1 is a perspective view of a multilayer LC filter 100 according to a first preferred embodiment of the present invention.

Preferred embodiments of the present invention are described below with reference to drawings.

The preferred embodiments are illustrative of the present invention, and the present invention is not restricted to the contents of the preferred embodiments. The contents of different preferred embodiments may be combined, the combined preferred embodiment may be provided, and in this case, the content of the combined preferred embodiments is also included in the scope of the present invention. The drawings are provided to facilitate understanding of the specification, schematic depiction may be used, and the ratio of dimensions of an element or the ratios between dimensions of elements may not be the same as the ratios described in the specification. An element described in the specification may be omitted in the drawings, and some of the elements may be omitted in the drawings.

First Preferred Embodiment

Figure 2:
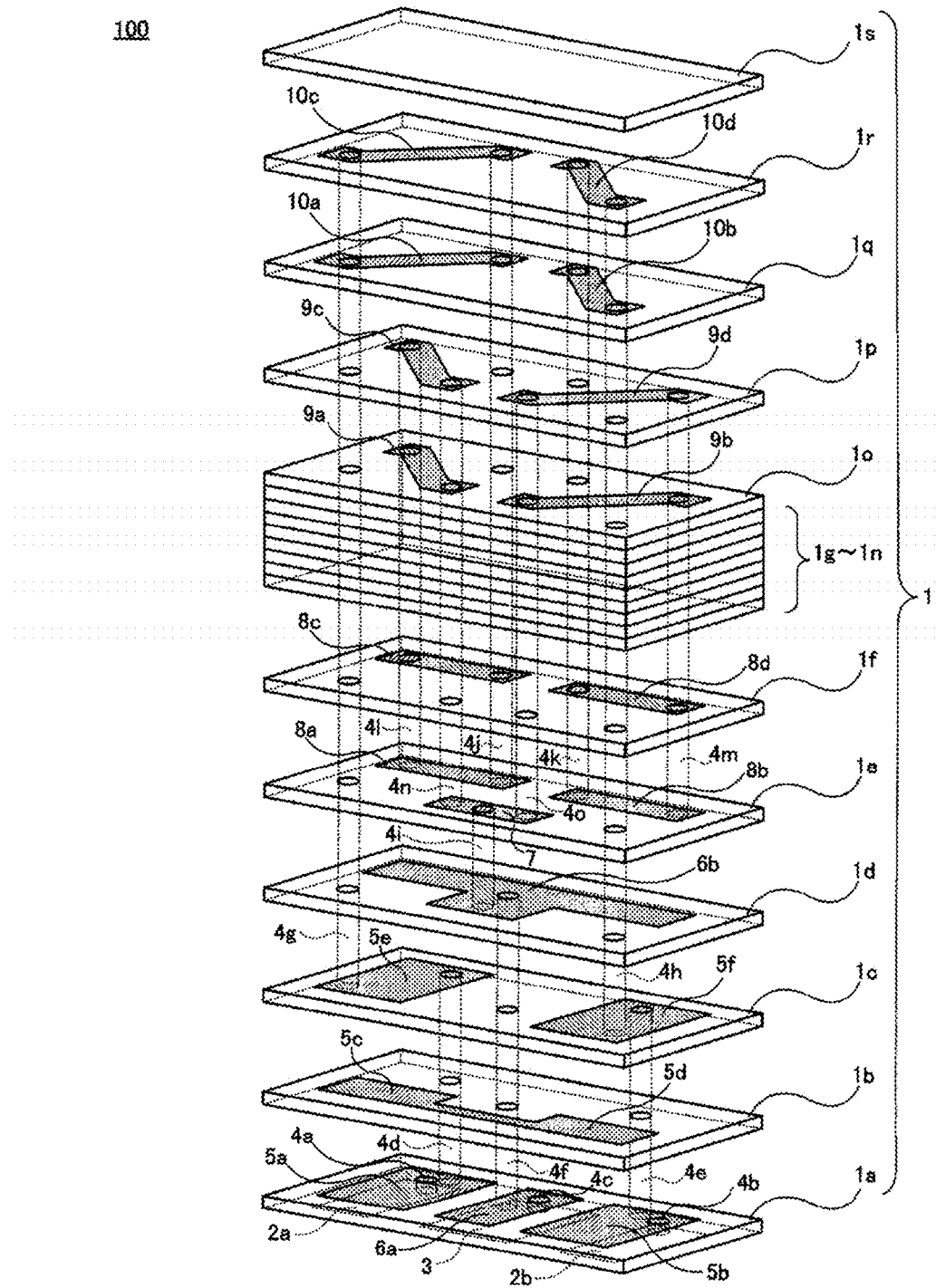
FIG. 2 is an exploded perspective view of the multilayer LC filter 100.
Figure 3:
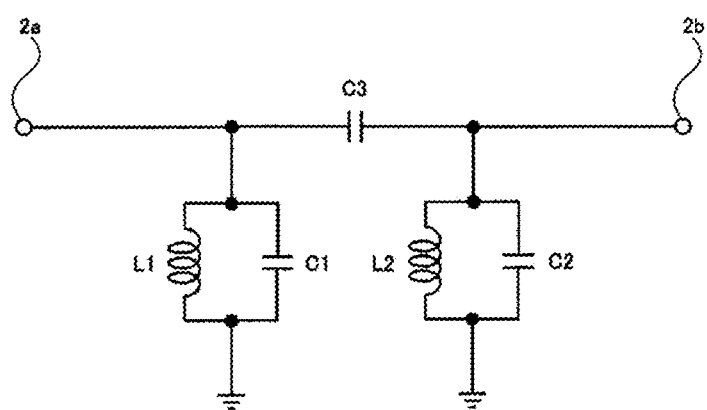
FIG. 3 is an equivalent circuit diagram of the multilayer LC filter 100.

FIGS. 1 to 4 illustrate a multilayer LC filter 100 according to a first preferred embodiment of the present invention. FIG. 1 is a perspective view of the multilayer LC filter 100. FIG. 2 is an exploded perspective view of the multilayer LC filter 100. FIG. 3 is an equivalent circuit diagram of the multilayer LC filter 100. FIG. 4A is a perspective view of a main portion of the multilayer LC filter 100. FIG. 4B is a plan view of the main portion of the multilayer LC filter 100.

The multilayer LC filter 100 includes a multilayer body 1 preferably having a rectangular or substantially rectangular parallelepiped shape, for example.

A first input/output terminal $2a$, a second input/output terminal $2b$, and a ground terminal 3 are disposed on a lower principal surface of the multilayer body 1.

As illustrated in FIG. 2, the multilayer body 1 includes 19 dielectric layers $1a$ to $1s$, which may preferably be made of, for example, a ceramic material, that are laminated from below in sequence.

The first input/output terminal $2a$, the second input/output terminal $2b$, and the ground terminal 3 are disposed on a lower principal surface of the dielectric layer $1a$.

Via conductors $4a$, $4b$, and $4c$ extend through the dielectric layer $1a$.

Capacitor conductive patterns $5a$ and $5b$ and a ground conductive pattern $6a$ are disposed on an upper principal surface of the dielectric layer $1a$. The capacitor conductive pattern $5a$ and the first input/output terminal $2a$ are connected by the via conductor $4a$. The capacitor conductive pattern $5b$ and the second input/output terminal $2b$ are connected by the via conductor $4b$. The ground conductive pattern $6a$ and the ground terminal 3 are connected by the via conductor $4c$.

Via conductors $4d$, $4e$, and $4f$ extend through the dielectric layer $1b$.

Capacitor conductive patterns $5c$ and $5d$ are disposed on an upper principal surface of the dielectric layer $1b$. The capacitor conductive pattern $5c$ and the capacitor conductive pattern $5d$ are connected to each other.

The via conductors $4d$, $4e$, and $4f$ extend through the dielectric layer $1c$. The via conductors having the same reference numerals disposed in different layers are joined together. For example, the via conductor $4d$ disposed in the dielectric layer $1b$ and the via conductor $4d$ disposed in the dielectric layer $1c$ are an integrated element in which both are joined together and have the same reference numeral.

Capacitor conductive patterns $5e$ and $5f$ are disposed on an upper principal surface of the dielectric layer $1c$. The capacitor conductive pattern $5e$ and the capacitor conductive pattern $5a$ are connected by the via conductor $4d$. The capacitor conductive pattern $5f$ and the capacitor conductive pattern $5b$ are connected by the via conductor $4e$.

The via conductor $4f$ and via conductors $4g$ and $4h$, which are newly described here, extend through the dielectric layer $1d$.

A ground conductive pattern 6b is disposed on an upper principal surface of the dielectric layer 1d. The ground conductive pattern 6b and the ground conductive pattern 6a are connected by the via conductor 4f.

The via conductors 4g and 4h and a via conductor 4i extend through the dielectric layer 1e.

A relay conductive pattern 7 and second linear conductive patterns 8a and 8b are disposed on an upper principal surface of the dielectric layer 1e. The relay conductive pattern 7 and the ground conductive pattern 6b are connected by the via conductor 4i.

The via conductors 4g and 4h and via conductors 4j, 4k, 4l, 4m, 4n, and 4o extend through the dielectric layer 1f.

Second linear conductive patterns 8c and 8d are disposed on an upper principal surface of the dielectric layer if. The relationships of connections of linear conductive patterns with via conductors interposed therebetween are collectively described below.

The dielectric layers 1g to 1o are laminated so as to increase the lengths of the via conductors 4g, 4h, 4j, 4k, 4l, 4m, 4n, and 4o.

The via conductors 4g, 4h, 4j, 4k, 4l, 4m, 4n, and 4o extend through the dielectric layers 1g to 1o.

Third linear conductive patterns 9a and 9b are disposed on an upper principal surface of the dielectric layer 1o.

The via conductors 4g, 4h, 4j, 4k, 4l, 4m, 4n, and 4o extend through the dielectric layer 1p.

Third linear conductive patterns 9c and 9d are disposed on an upper principal surface of the dielectric layer 1p.

The via conductors 4g, 4h, 4j, and 4k extend through the dielectric layer 1q.

First linear conductive patterns 10a and 10b are disposed on an upper principal surface of the dielectric layer 1q.

The via conductors 4g, 4h, 4j, and 4k extend through the dielectric layer 1r.

First linear conductive patterns 10c and 10d are disposed on an upper principal surface of the dielectric layer 1r.

The dielectric layer 1s is a protective layer. None of the capacitor conductive patterns, ground conductor patterns, and linear conductive patterns are disposed on the dielectric layer 1s, and none of the via conductors are disposed therein.

Figure 4A:
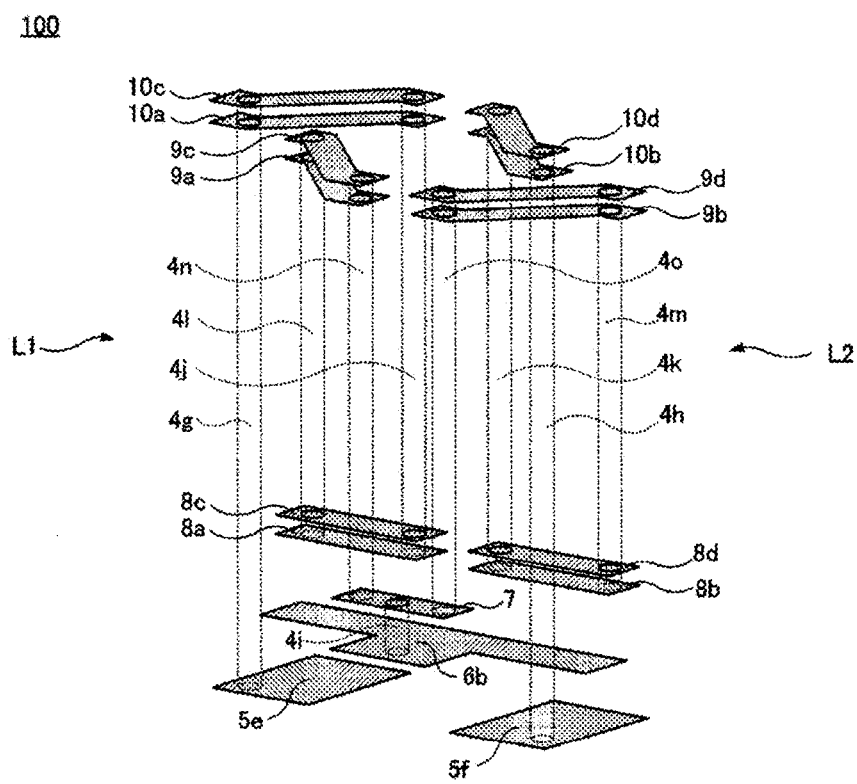
FIG. 4A is a perspective view of a main portion of the multilayer LC filter 100.

FIG. 4A illustrates the capacitor conductive patterns 5e and 5f, the ground conductive pattern 6b, the relay conductive pattern 7, the second linear conductive patterns 8a, 8b, 8c, and 8d, the third linear conductive patterns 9a, 9b, 9c, and 9d, the first linear conductive patterns 10a, 10b, 10c, and 10d, and the via conductors 4g, 4h, 4i, 4j, 4k, 4l, 4m, 4n, and 4o, which are extracted from the multilayer LC filter 100. FIG. 4A is a perspective view.

The capacitor conductive pattern 5e and a first end of each of the first linear conductive patterns 10a and 10c are connected by the via conductor 4g. A second end of each of the first linear conductive patterns 10a and 10c and a first end of each of the second linear conductive patterns 8a and 8c are connected by the via conductor 4j. A second end of each of the second linear conductive patterns 8a and 8c and a first end of each of the third linear conductive patterns 9a and 9c are connected by the via conductor 4l. A second end of each of the third linear conductive patterns 9a and 9c and the relay conductive pattern 7 are connected by the via conductor 4n. The relay conductive pattern 7 and the ground conductive pattern 6b are connected by the via conductor 4i.

In the multilayer LC filter 100, a conductive line connecting the via conductor 4g, the first linear conductive patterns 10a and 10c, the via conductor 4j, the second linear conductive patterns 8a and 8c, the via conductor 4l, the third linear conductive patterns 9a and 9c, the via conductor 4n, the relay conductive pattern 7, and the via conductor 4i in sequence defines a first inductor L1.

In the first inductor L1, the first linear conductive pattern 10a and the first linear conductive pattern 10c are connected as one set, the second linear conductive pattern 8a and the second linear conductive pattern 8c are connected as one set, and the third linear conductive pattern 9a and the third linear conductive pattern 9c are connected as one set, thus reducing the internal resistance and improving the Q value.

In the first inductor L1, the distance between the second linear conductive patterns 8a and 8c and the third linear conductive patterns 9a and 9c is larger than the distance between the third linear conductive patterns 9a and 9c and the first linear conductive patterns 10a and 10c. Thus, the volume inside the multilayer body 1 is effectively used, and the first inductor L1 has a large inductance value.

Similarly, the capacitor conductive pattern 5f and a first end of each of the first linear conductive patterns 10b and 10d are connected by the via conductor 4h. A second end of each of the first linear conductive patterns 10b and 10d and a first end of each of the second linear conductive patterns 8b and 8d are connected by the via conductor 4k. A second end of each of the second linear conductive patterns 8b and 8d and a first end of each of the third linear conductive patterns 9b and 9d are connected by the via conductor 4m. A second end of each of the third linear conductive patterns 9b and 9d and the relay conductive pattern 7 are connected by the via conductor 4o. The relay conductive pattern 7 and the ground conductive pattern 6b are connected by the via conductor 4i.

In the multilayer LC filter 100, a conductive line connecting the via conductor 4h, the first linear conductive patterns 10b and 10d, the via conductor 4k, the second linear conductive patterns 8b and 8d, the via conductor 4m, the third linear conductive patterns 9b and 9d, the via conductor 4o, the relay conductive pattern 7, and the via conductor 4i in sequence defines a second inductor L2. The portion including the relay conductive pattern 7 and the via conductor 4i is shared by the first inductor L1 and the second inductor L2.

In the second inductor L2, the first linear conductive pattern 10b and the first linear conductive pattern 10d are connected as one set, the second linear conductive pattern 8b and the second linear conductive pattern 8d are connected as one set, and the third linear conductive pattern 9b and the third linear conductive pattern 9d are connected as one set, thus reducing the internal resistance and improving the Q value.

In the second inductor L2, the distance between the second linear conductive patterns 8b and 8d and the third linear conductive patterns 9b and 9d is larger than the distance between the third linear conductive patterns 9b and 9d and the first linear conductive patterns 10b and 10d. Thus, the volume inside the multilayer body 1 is effectively used, and the second inductor L2 has a large inductance value.

The multilayer LC filter 100 having the above-described structure according to the first preferred embodiment is able to be produced using materials and a manufacturing method widely used in known multilayer LC filters.

The multilayer LC filter 100 having the above-described structure according to the first preferred embodiment has an equivalent circuit illustrated in FIG. 3.

The multilayer LC filter 100 includes a first LC resonator in which the first inductor L1 and a first capacitor C1 are connected in parallel and a second LC resonator in which the second inductor L2 and a second capacitor C2 are connected in parallel. The first LC resonator includes a first end connected to the first input/output terminal 2a and a second end connected to the ground. The second LC resonator includes a first end connected to the second input/output terminal 2b and a second end connected to the ground. The first end of the first LC resonator and the first end of the second LC resonator are connected by a third capacitor C3.

Next, the relationship between the structure and the equivalent circuit of the multilayer LC filter 100 is described with reference to FIGS. 2 to 4B.

In the multilayer LC filter 100, the first inductor L1 is defined by the conductive line connecting the via conductor 4g, the first linear conductive patterns 10a and 10c, the via conductor 4j, the second linear conductive patterns 8a and 8c, the via conductor 4l, the third linear conductive patterns 9a and 9c, the via conductor 4n, the relay conductive pattern 7, and the via conductor 4i in sequence, as previously described.

The first capacitor C1 is defined by the capacitance between the capacitor conductive pattern 5e and the ground conductive pattern 6b.

The via conductor 4g, which is a first end of the first inductor L1, and the capacitor conductive pattern 5e, which is a first electrode of the first capacitor C1, are connected to each other. The via conductor 4i, which is a second end of the first inductor L1, and the ground conductive pattern 6b, which is a second electrode of the first capacitor C1, are connected to each other. Therefore, the first inductor L1 and the first capacitor C1 are connected in parallel and define the first LC resonator. The capacitor conductive pattern 5e is connected to the first input/output terminal 2a with the via conductor 4d, the capacitor conductive pattern 5a, and the via conductor 4a interposed therebetween. The ground conductive pattern 6b is connected to the ground terminal 3 with the via conductor 4f, the ground conductive pattern 6a, and the via conductor 4c interposed therebetween.

The second inductor L2 is defined by the conductive line connecting the via conductor 4h, the first linear conductive patterns 10b and 10d, the via conductor 4k, the second linear conductive patterns 8b and 8d, the via conductor 4m, the third linear conductive patterns 9b and 9d, the via conductor 4o, the relay conductive pattern 7, and the via conductor 4i in sequence.

The second capacitor C2 is defined by the capacitance between the capacitor conductive pattern 5f and the ground conductive pattern 6b.

The via conductor 4h, which is a first end of the second inductor L2, and the capacitor conductive pattern 5f, which is a first electrode of the second capacitor C2, are connected to each other. The via conductor 4i, which is a second end of the second inductor L2, and the ground conductive pattern 6b, which is a second electrode of the second capacitor C2, are connected to each other. Therefore, the second inductor L2 and the second capacitor C2 are connected in parallel and define the second LC resonator. The capacitor conductive pattern 5f is connected to the second input/output terminal 2b with the via conductor 4e, the capacitor conductive pattern 5b, and the via conductor 4b interposed therebetween. The ground conductive pattern 6b is connected to the ground terminal 3 with the via conductor 4f, the ground conductive pattern 6a, and the via conductor 4c interposed therebetween.

The third capacitor C3 is defined by the capacitance between the capacitor conductive patterns 5a and 5e and the capacitor conductive pattern 5c and the capacitance between the capacitor conductive pattern 5d and the capacitor conductive patterns 5b and 5f. As previously described, the capacitor conductive pattern 5c and the capacitor conductive pattern 5d are connected to each other.

In the multilayer LC filter 100 having the above-described structure and equivalent circuit according to the first preferred embodiment, the inductance values of the first inductor L1 and the second inductor L2 are large, the Q values are high, and the insertion loss is small.

Figure 4B:
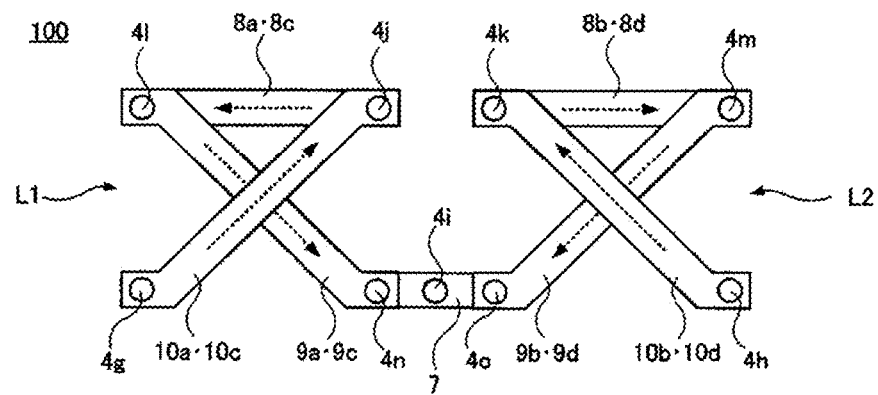
FIG. 4B is a plan view of the main portion of the multilayer LC filter 100.

FIG. 4B illustrates the relay conductive pattern 7, the second linear conductive patterns 8a, 8b, 8c, and 8d, the third linear conductive patterns 9a, 9b, 9c, and 9d, the first linear conductive patterns 10a, 10b, 10c, and 10d, and the via conductors 4g, 4h, 4i, 4j, 4k, 4l, 4m, 4n, and 4o, which define the first inductor L1 and the second inductor L2 and which are extracted from the multilayer LC filter 100. FIG. 4B is a plan view. In FIG. 4B, the direction in which a current flows is indicated by broken lines with arrows.

As is clear from FIG. 4B, when the first inductor L1 is seen in the lamination direction of the multilayer body 1, the first linear conductive patterns 10a and 10c and the third linear conductive patterns 9a and 9c intersect with each other preferably at about 90 degrees, for example. With such a structure, the first inductor L1 has a long inductor length, a large inductance value, and a high Q value. With the structure in which the first linear conductive patterns 10a and 10c and the third linear conductive patterns 9a and 9c intersect with each other at about 90 degrees, the interference of magnetic fluxes generated by them is reduced to a significantly reduced or minimum level, and reduction in the inductance value is prevented.

Similarly, as is clear from FIG. 4B, when the second inductor L2 is seen in the lamination direction of the multilayer body 1, the first linear conductive patterns 10b and 10d and the third linear conductive patterns 9b and 9d intersect with each other preferably at about 90 degrees, for example. With such a structure, the second inductor L2 has a long inductor length, a large inductance value, and a high Q value. With the structure in which the first linear conductive patterns 10b and 10d and the third linear conductive patterns 9b and 9d intersect with each other at about 90 degrees, the interference of magnetic fluxes generated thereby is reduced to a significantly reduced or minimum level, and reduction in the inductance value is prevented.

Figure 5:
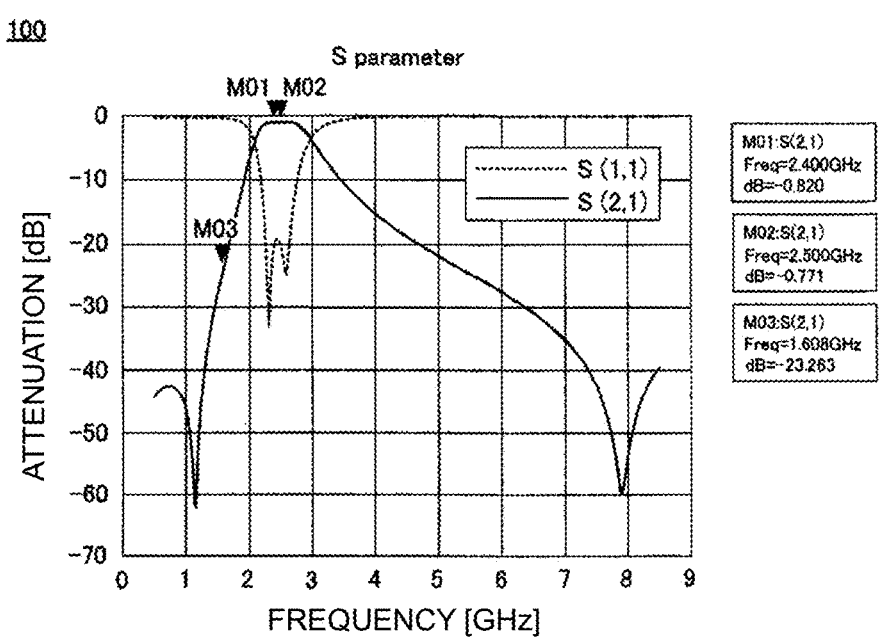
FIG. 5 illustrates frequency characteristics of the multilayer LC filter 100.

The frequency characteristics of the multilayer LC filter 100 are illustrated in FIG. 5.

For comparison, a multilayer LC filter 1200 according to a first comparative example and a multilayer LC filter 1300 according to a second comparative example are prepared.

Figure 6A:
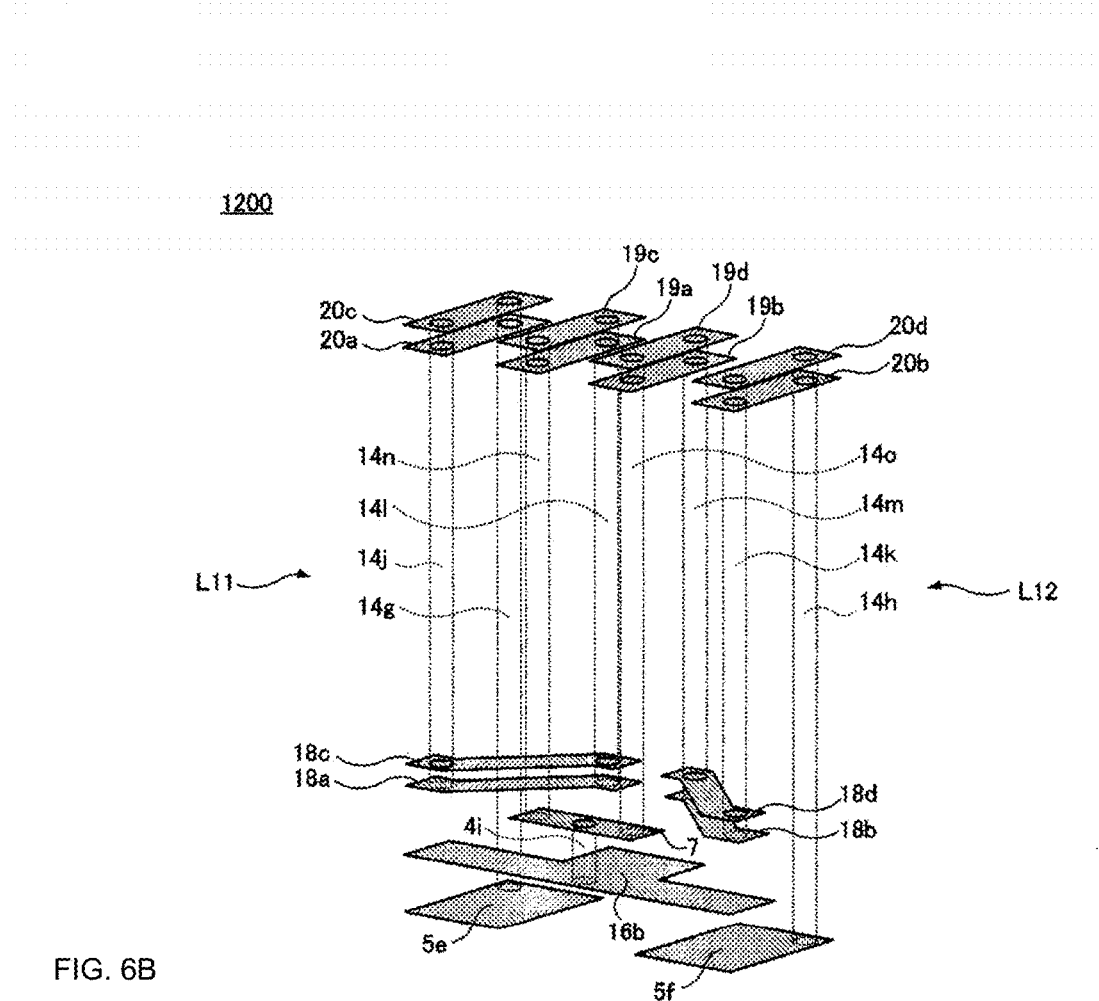
FIG. 6A is a perspective view of a main portion of a multilayer LC filter 1200 according to a first comparative example.
Figure 6B:
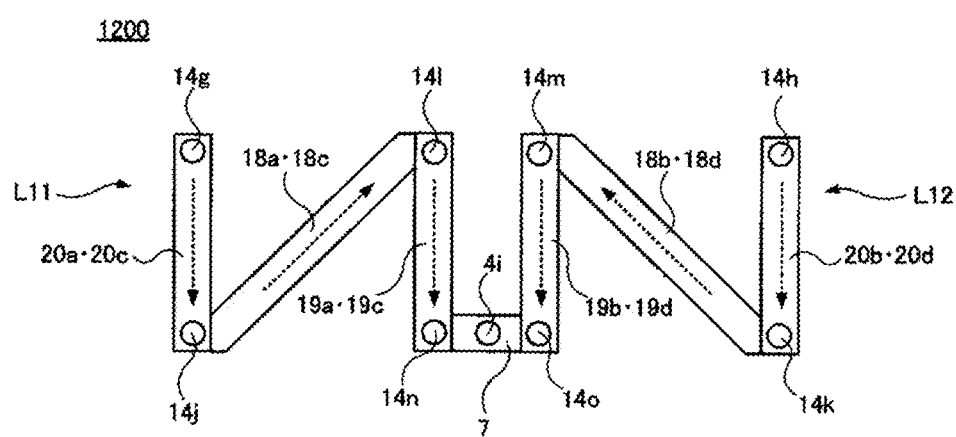
FIG. 6B is a plan view of the main portion of the multilayer LC filter 1200.

The multilayer LC filter 1200 according to the first comparative example is illustrated in FIGS. 6A and 6B. FIG. 6A is a perspective view of a main portion thereof, and FIG. 6B is a plan view of the main portion. In FIG. 6B, the direction in which a current flows is indicated by broken lines with arrows.

The multilayer LC filter 1200 according to the first comparative example includes a first inductor L11 and a second inductor L12, both of which have a helical structure. The configurations other than the first inductor L11 and the second inductor L12 in the multilayer LC filter 1200 are the same or substantially the same as those in the multilayer LC filter 100. In the multilayer LC filter 1200, the portions having the same or substantially the same configurations as those in the multilayer LC filter 100 are denoted by the same reference numerals.

The first inductor L11 is defined by a conductive line connecting a via conductor 14g, first linear conductive patterns 20a and 20c, a via conductor 14j, second linear conductive patterns 18a and 18c, a via conductor 14l, third linear conductive patterns 19a and 19c, a via conductor 14n, the relay conductive pattern 7, and the via conductor 4i in sequence. In the first inductor L11, the conductive line has a helical structure, but the first linear conductive patterns 20a and 20c and the third linear conductive patterns 19a and 19c do not intersect with each other. The first inductor L11 has a shorter inductor length, a smaller inductance value, and a lower Q value, in comparison with the first inductor L1 in the multilayer LC filter 100.

The second inductor L12 is defined by a conductive line connecting a via conductor 14h, first linear conductive patterns 20b and 20d, a via conductor 14k, second linear conductive patterns 18b and 18d, a via conductor 14m, third linear conductive patterns 19b and 19d, a via conductor 14o, the relay conductive pattern 7, and the via conductor 4i in sequence. In the second inductor L12, the conductive line has a helical structure, but the first linear conductive patterns 20b and 20d and the third linear conductive patterns 19b and 19d do not intersect with each other. The second inductor L12 has a shorter inductor length, a smaller inductance value, and a lower Q value, in comparison with the second inductor L2 in the multilayer LC filter 100.

Figure 7:
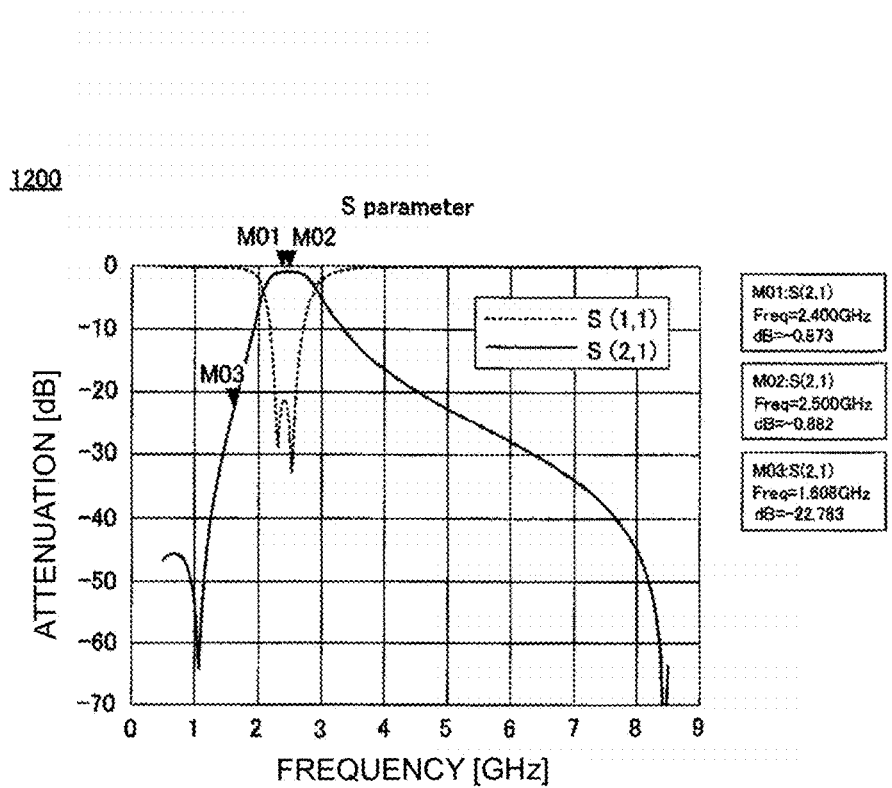
FIG. 7 illustrates frequency characteristics of the multilayer LC filter 1200.

The frequency characteristics of the multilayer LC filter 1200 according to the first comparative example are illustrated in FIG. 7.

Figure 8A:
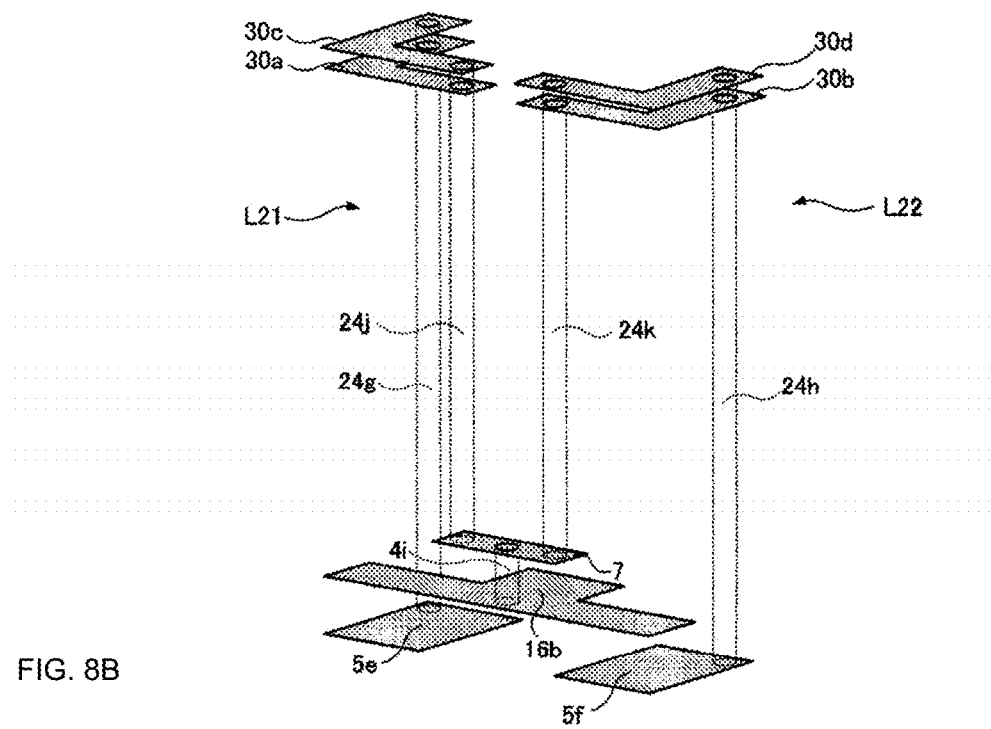
FIG. 8A is a perspective view of a main portion of a multilayer LC filter 1300 according to a second comparative example.
Figure 8B:
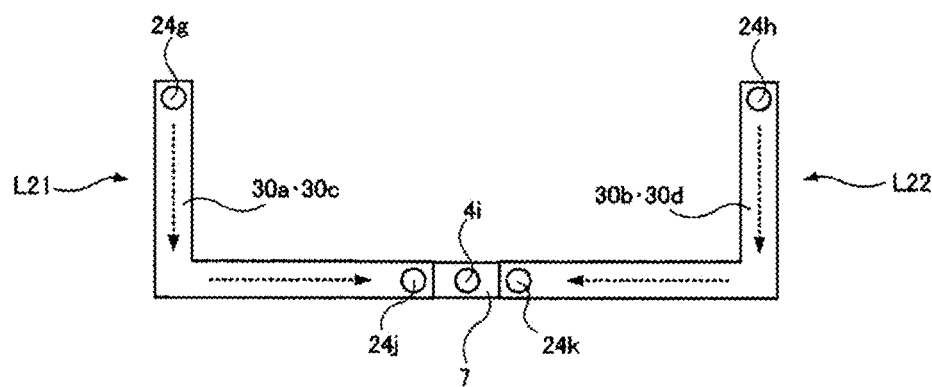
FIG. 8B is a plan view of the main portion of the multilayer LC filter 1300.

The multilayer LC filter 1300 according to the second comparative example is illustrated in FIGS. 8A and 8B. FIG. 8A is a perspective view of a main portion thereof, and FIG. 8B is a plan view of the main portion. In FIG. 8B, the direction in which a current flows is indicated by broken lines with arrows.

The multilayer LC filter 1300 according to the second comparative example includes a first inductor L21 and a second inductor L22. The configurations other than the first inductor L21 and the second inductor L22 in the multilayer LC filter 1300 are the same or substantially the same as those in the multilayer LC filter 100. In the multilayer LC filter 1300, the portions having the same or substantially the same configurations as those in the multilayer LC filter 100 are denoted by the same reference numerals.

The first inductor L21 is defined by a conductive line connecting a via conductor 24g, L-shaped first linear conductive patterns 30a and 30c, a via conductor 24j, the relay conductive pattern 7, and the via conductor 4i in sequence. The first inductor L21 has a shorter inductor length, a smaller inductance value, and a lower Q value, in comparison with the first inductor L1 in the multilayer LC filter 100 and the first inductor L11 in the multilayer LC filter 1200.

The second inductor L22 is defined by a conductive line connecting a via conductor 24h, L-shaped first linear conductive patterns 30b and 30d, a via conductor 24k, the relay conductive pattern 7, and the via conductor 4i in sequence. The second inductor L22 has a shorter inductor length, a smaller inductance value, and a lower Q value, in comparison with the second inductor L2 in the multilayer LC filter 100 and the second inductor L12 in the multilayer LC filter 1200.

Figure 9:
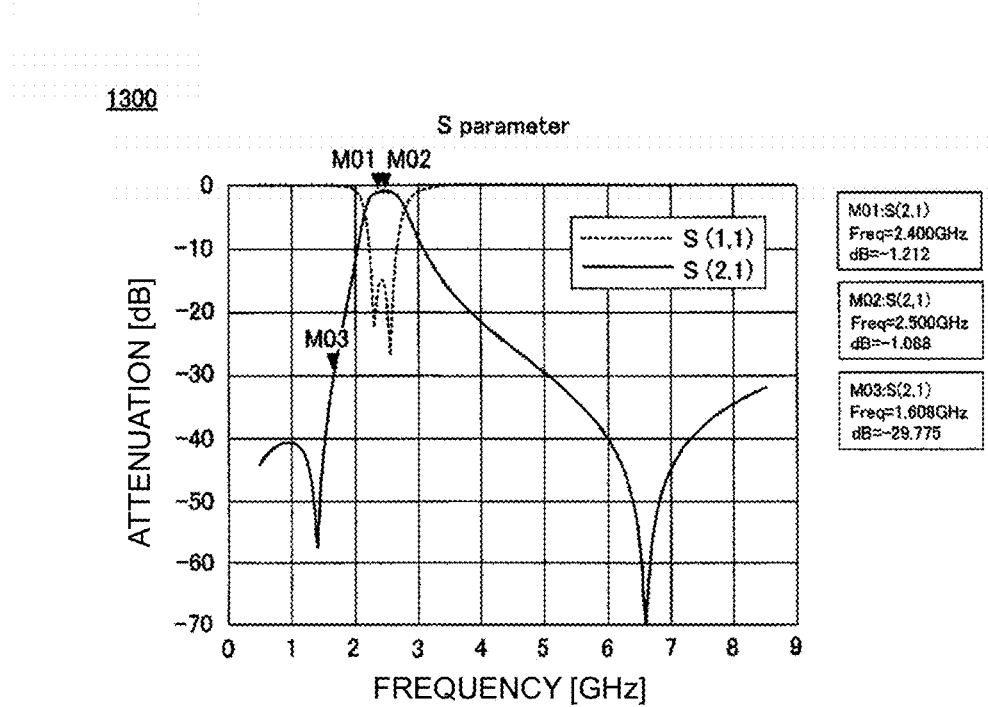
FIG. 9 illustrates frequency characteristics of the multilayer LC filter 1300.

The frequency characteristics of the multilayer LC filter 1300 according to the second comparative example are illustrated in FIG. 9.

As is clear from FIGS. 5, 7, and 9, each of the multilayer LC filter 100 according to the first preferred embodiment, the multilayer LC filter 1200 according to the first comparative example, and the multilayer LC filter 1300 according to the second comparative example has the frequency characteristics as a band pass filter.

The attenuations in S(2, 1) characteristics at about 2.400 GHz (M01) and about 2.500 GHz (M02) within the pass band and at about 1.608 GHz (M03) outside the pass band are measured for each of the multilayer LC filter 100, the multilayer LC filter 1200, and the multilayer LC filter 1300.

The attenuations within the pass band for the multilayer LC filter 100 are about −0.820 dB at about 2.400 GHz (M01) and − about 0.771 dB at about 2.500 GHz (M02), and they are small.

In contrast, the attenuations within the pass band for the multilayer LC filter 1200 are about −0.873 dB at about 2.400 GHz (M01) and about −0.882 dB at about 2.500 GHz (M02), and they are large. The attenuations within the pass band for the multilayer LC filter 1300 are about −1.212 dB at about 2.400 GHz (M01) and about −1.088 dB at about 2.500 GHz (M02), and they are even larger.

The reason why the attenuations within the pass band for the multilayer LC filter 100 according to the first preferred embodiment are small may be that each of the first inductor L1 and the second inductor L2 has a long inductor length, a large inductance value, and a high Q value. The multilayer LC filter 100 according to the first preferred embodiment has better frequency characteristics in which the insertion loss is smaller, in comparison with the multilayer LC filter 1200 and multilayer LC filter 1300 according to the comparative examples.

Second Preferred Embodiment

Figure 10:
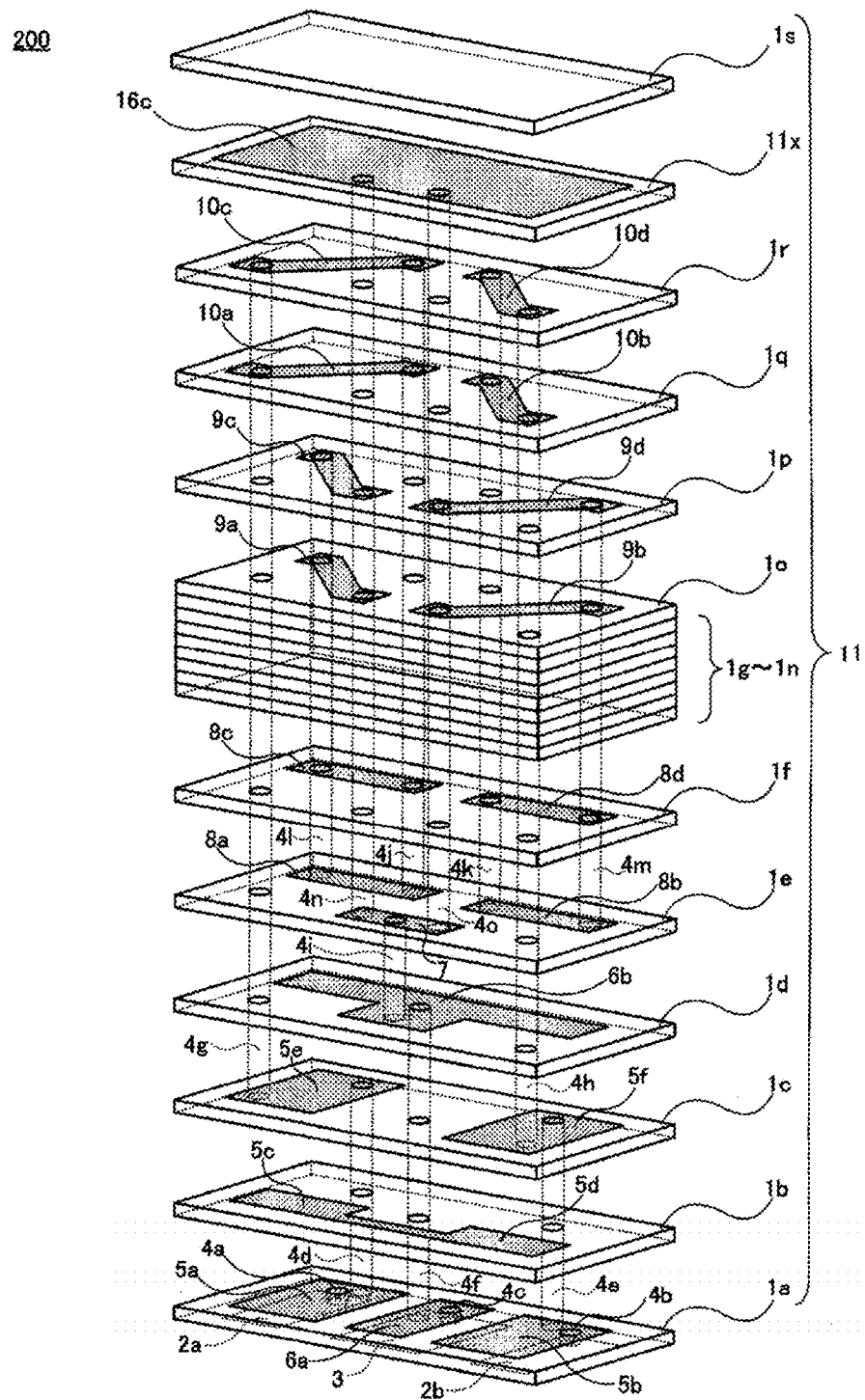
FIG. 10 is an exploded perspective view of a multilayer LC filter 200 according to a second preferred embodiment of the present invention.
Figure 11:
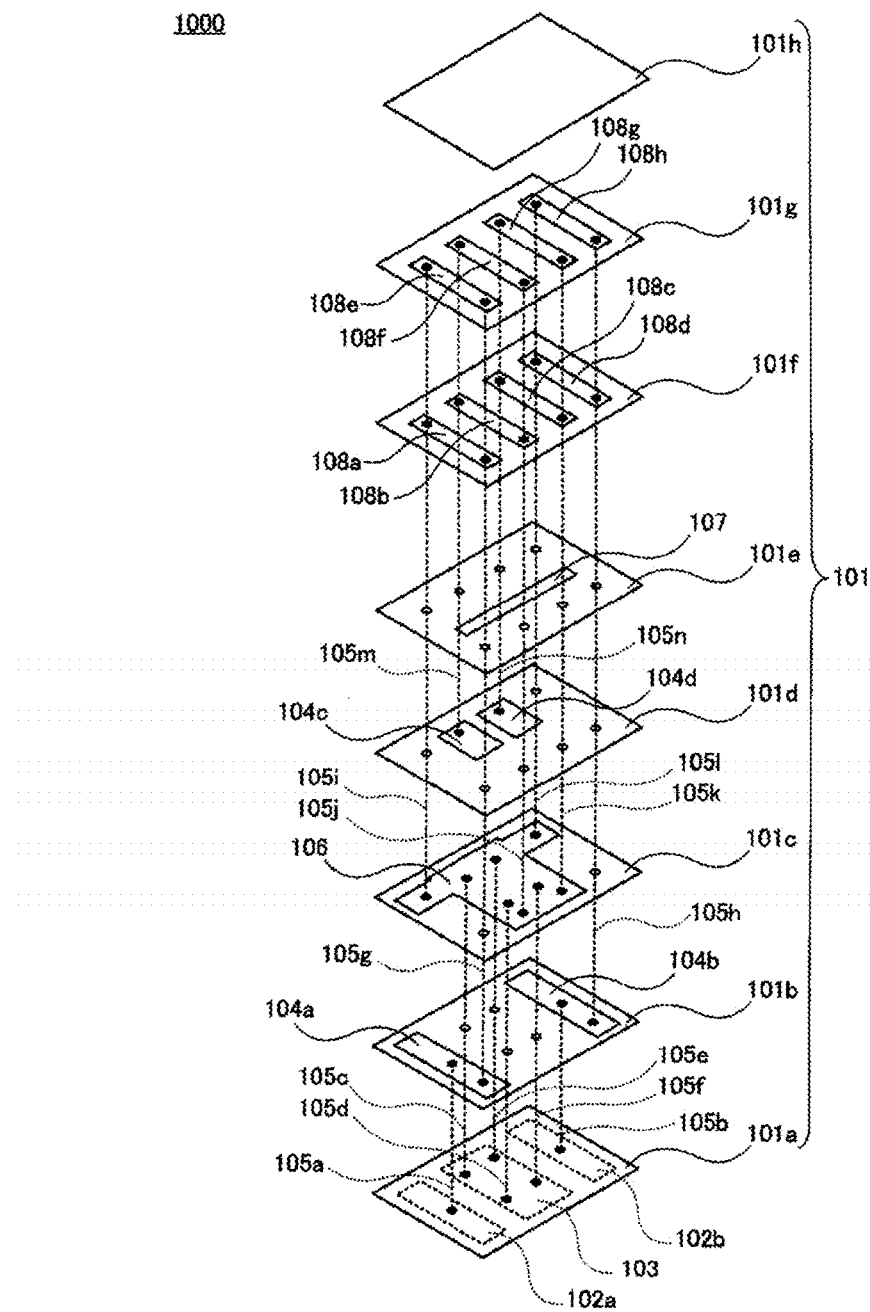
FIG. 11 is an exploded perspective view of a multilayer LC filter 1000 disclosed in Japanese Unexamined Patent Application Publication No. 2014-57277.

FIG. 10 illustrates a multilayer LC filter 200 according to a second preferred embodiment of the present invention. FIG. 10 is an exploded perspective view of the multilayer LC filter 200.

In the multilayer LC filter 200, a new configuration is added to the multilayer LC filter 100 according to the first preferred embodiment.

Specifically, the multilayer LC filter 200 includes a dielectric layer 11x with a ground conductive pattern 16c disposed on an upper principal surface thereof is provided between the dielectric layer 1r and the dielectric layer is included in the multilayer body 1 in the multilayer LC filter 100. In the multilayer LC filter 200, the second ends of the via conductors 4n and 4o, whose first ends are connected to the relay conductive pattern 7 in the multilayer LC filter 100, are extended to the dielectric layer 11x and connected to the ground conductive pattern 16c. That is, the via conductors 4n and 4o in the multilayer LC filter 100 are disposed in the dielectric layers 1f to 1p, whereas the via conductors 4n and 4o in the multilayer LC filter 200 are disposed in, in addition to the dielectric layers 1f to 1p, the dielectric layers 1q, 1r, and 11x.

The multilayer LC filter 200 according to the second preferred embodiment has an additional advantage described below, in addition to the advantages of the multilayer LC filter 100 according to the first preferred embodiment. In the multilayer LC filter 200, the ground conductive pattern 16c reduced or prevents an entry of noise from the outside, and thus, a malfunction caused by noise from the outside is reduced or prevented. In the multilayer LC filter 200, the ground conductive pattern 16c reduces or prevents leakage of noise to the outside.

The multilayer LC filter 100 according to the first preferred embodiment and the multilayer LC filter 200 according to the second preferred embodiment are described above. The present invention is not restricted to the preferred embodiments described above, and various changes may be made in the spirit and scope of the present invention.

For example, each of the multilayer LC filters 100 and 200, which defines a two-stage band pass filter, may define any type of filter, such as a high pass filter or a low pass filter. The number of stages is also not restricted to two, and may be three or more. The filter may have any circuitry and may be freely configured.

In the multilayer LC filters 100 and 200, the second linear conductive patterns 8*a* to 8*d*, the third linear conductive patterns 9*a* to 9*d*, and the first linear conductive patterns 10*a* to 10*d* are laminated in sequence from below inside the multilayer body 1. This sequence may be changed. For example, the second linear conductive patterns 8*a* to 8*d*, the first linear conductive patterns 10*a* to 10*d*, and the third linear conductive patterns 9*a* to 9*d* may be laminated in sequence from below inside the multilayer body 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter comprising:
 a multilayer body including a plurality of dielectric layers that are laminated;
 a plurality of linear conductive patterns between the plurality of dielectric layers;
 a plurality of capacitor conductive patterns between the plurality of dielectric layers;
 at least one ground conductive pattern between the plurality of dielectric layers; and
 a plurality of via conductors extending through the plurality of dielectric layers; wherein
 a plurality of inductors defined by the plurality of via conductors and the plurality of linear conductive patterns are alternately connected;
 a plurality of capacitors are defined by capacitances between the plurality of capacitor conductive patterns and the at least one ground conductive pattern or capacitances between the plurality of capacitor conductive patterns;
 a plurality of LC resonators defined by the plurality of inductors and the plurality of capacitors are connected and;
 at least one of the plurality of inductors includes at least three of the plurality of linear conductive patterns, and when the multilayer body is seen through in a direction in which the plurality of dielectric layers are laminated, two of the at least three of the plurality of linear conductive patterns included in the at least one of the plurality of inductors intersect with each other at a portion between one end portion and another end portion of each of the two of the at least three of the plurality of linear conductive patterns.

2. The multilayer LC filter according to claim 1, wherein
 at least one of the plurality of inductors includes at least a first linear conductive pattern, a second linear conductive pattern, and a third linear conductive pattern of the plurality of linear conductor patterns;
 at least one of the plurality of capacitor conductive patterns and the first linear conductive pattern are connected by at least one of the plurality of via conductors;
 the first linear conductive pattern and the second linear conductive pattern are connected by at least one of the plurality of via conductors;
 the second linear conductive pattern and the third linear conductive pattern are connected by at least one of the plurality of via conductors;
 the third linear conductive pattern and the at least one ground conductive pattern are connected by at least one of the plurality of via conductors; and
 when the multilayer body is seen through in the direction in which the plurality of dielectric layers are laminated, the first linear conductive pattern and the third linear conductive pattern intersect with each other.

3. The multilayer LC filter according to claim 2, wherein
 the second linear conductive pattern, the third linear conductive pattern, and the first linear conductive pattern are laminated in this order inside the multilayer body; and
 a distance between the second linear conductive pattern and the third linear conductive pattern is longer than a distance between the third linear conductive pattern and the first linear conductive pattern.

4. The multilayer LC filter according to claim 3, wherein an angle of the intersection is 90 degrees.

5. The multilayer LC filter according to claim 2, wherein an angle of the intersection is 90 degrees.

6. The multilayer LC filter according to claim 2, wherein
 the second linear conductive pattern, the first linear conductive pattern, and the third linear conductive pattern are laminated in this order inside the multilayer body; and
 a distance between the second linear conductive pattern and the first linear conductive pattern is longer than a distance between the first linear conductive pattern and the third linear conductive pattern.

7. The multilayer LC filter according to claim 6, wherein an angle of the intersection is 90 degrees.

8. The multilayer LC filter according to claim 1, wherein an angle of the intersection is about 90 degrees.

* * * * *